(12) United States Patent
Strafiel et al.

(10) Patent No.: US 10,840,703 B2
(45) Date of Patent: Nov. 17, 2020

(54) METHOD AND DEVICE FOR DETECTING AN ELECTRICAL VOLTAGE IN A SUPPLY NETWORK

(71) Applicant: Wobben Properties GmbH, Aurich (DE)

(72) Inventors: Christian Strafiel, Aurich (DE); Sönke Engelken, Bremen (DE); Ingo Mackensen, Aurich (DE); Stefan Gertjegerdes, Aurich (DE); William Meli, Hamburg (DE)

(73) Assignee: Wobben Properties GmbH, Aurich (DE)

( * ) Notice: Subject to any disclaimer, the term of this patent is extended or adjusted under 35 U.S.C. 154(b) by 173 days.

(21) Appl. No.: 15/746,632

(22) PCT Filed: Jul. 13, 2016

(86) PCT No.: PCT/EP2016/066587
§ 371 (c)(1),
(2) Date: Jan. 22, 2018

(87) PCT Pub. No.: WO2017/016870
PCT Pub. Date: Feb. 2, 2017

(65) Prior Publication Data
US 2018/0219376 A1 Aug. 2, 2018

(30) Foreign Application Priority Data

Jul. 24, 2015 (DE) .......................... 10 2015 112 155

(51) Int. Cl.
*H02J 3/01* (2006.01)
*H02J 3/38* (2006.01)
(Continued)

(52) U.S. Cl.
CPC ................ *H02J 3/01* (2013.01); *F03D 7/044* (2013.01); *F03D 9/255* (2017.02); *F03D 17/00* (2016.05);
(Continued)

(58) Field of Classification Search
None
See application file for complete search history.

(56) References Cited

U.S. PATENT DOCUMENTS

| 6,014,017 A | 1/2000 | Weinhold et al. |
| 6,924,627 B1 | 8/2005 | Wobben |

(Continued)

FOREIGN PATENT DOCUMENTS

| CN | 1233355 A | 10/1999 |
| CN | 101617234 A | 12/2009 |

(Continued)

OTHER PUBLICATIONS

Bagheri et al., "Detection of Grid Voltage Fundamental and Harmonic Components Using Kalman Filter and Generalized Averaging Method," *IEEE Transactions on Power Electronics* 31(2):1064-1073, Feb. 2016.
(Continued)

*Primary Examiner* — Roy Y Yi
(74) *Attorney, Agent, or Firm* — Seed IP Law Group LLP (57) ABSTRACT

A method for recording the magnitude and phase of electrical voltage in an electrical three-phase supply network for a fundamental and at least one harmonic is provided. The method includes measuring an electrical three-phase voltage of the supply network, transforming the measured voltage values into polar coordinates using a rotating voltage phasor for the fundamental as a measured reference phasor, and respectively observing values of at least one voltage phasor for the fundamental and of at least one voltage phasor for at
(Continued)

least one harmonic to be recorded with the aid of a state observer, and tracking the observed values on the basis of the measured reference phasor.

18 Claims, 3 Drawing Sheets

(51) Int. Cl.
*G01R 19/25* (2006.01)
*G01R 25/00* (2006.01)
*G05B 19/05* (2006.01)
*G01R 19/00* (2006.01)
*H02J 3/24* (2006.01)
*F03D 17/00* (2016.01)
*F03D 9/25* (2016.01)
*F03D 7/04* (2006.01)
*H02M 1/12* (2006.01)

(52) U.S. Cl.
CPC ......... *G01R 19/2513* (2013.01); *G01R 25/00* (2013.01); *G05B 19/05* (2013.01); *H02J 3/24* (2013.01); *H02J 3/386* (2013.01); *H02M 1/12* (2013.01); *G01R 19/0084* (2013.01); *G05B 2219/13095* (2013.01); *Y02E 10/72* (2013.01); *Y02E 10/76* (2013.01)

(56) References Cited

U.S. PATENT DOCUMENTS

| | | | |
|---|---|---|---|
| 8,981,755 B2 | 3/2015 | Beekmann et al. | |
| 9,362,837 B2 | 6/2016 | Diedrichs et al. | |
| 9,473,042 B1 * | 10/2016 | Chu .................... | H02J 3/1857 |
| 2004/0158135 A1 | 8/2004 | Baker, Jr. et al. | |
| 2010/0213925 A1 | 8/2010 | Teodorescu et al. | |
| 2012/0150468 A1 | 6/2012 | Sahinoglu et al. | |
| 2013/0141951 A1 | 6/2013 | Adloff | |
| 2014/0307488 A1 | 10/2014 | Brogan et al. | |

FOREIGN PATENT DOCUMENTS

| | | | |
|---|---|---|---|
| DE | 10032447 A1 | 1/2002 | |
| DE | 102009023626 A1 | 12/2010 | |
| DE | 102011084910 A1 | 4/2013 | |
| EP | 2223405 B1 | 10/2012 | |
| JP | 2010220472 A | 9/2010 | |
| JP | 2012130238 A | 7/2012 | |
| JP | 2013078180 A | 4/2013 | |
| JP | 2014139541 A | 7/2014 | |
| WO | 2009056158 A1 | 5/2009 | |
| WO | WO-2013123433 A2 * | 8/2013 | .............. H02J 3/383 |

OTHER PUBLICATIONS

Beides et al., "Dynamic State Estimation of Power System Harmonics Using Kalman Filter Methodology," *IEEE Transactions on Power Delivery* 6(4):1663-1670, Oct. 1991.

Bitmead et al., "A Kalman Filtering Approach to Short-Time Fourier Analysis," *IEEE Transactions on Acoustics, Speech, and Signal Processing* ASSP-34(6):1493-1501, Dec. 1986.

Glad et al., *Control Theory : Multivariable and Nonlinear Methods*, Taylor & Francis, 2000, pp. 1-466 (242 pages).

La Scala et al., "Design of an Extended Kalman Filter Frequency Tracker," *IEEE Transactions on Signal Processing* 44(3):739-742, Mar. 1996.

McGrath et al., "Improved Power Converter Line Synchronisation Using an Adaptive Discrete Fourier Transform (DFT)," *Proceedings of the IEEE 33rd Annual Power Electronics Specialists Conference*, Cairns, Australia, Jun. 23-27, 2002, pp. 821-826.

Reza et al., "Instantaneous Power Quality Analysis Using Frequency Adaptive Kalman Filter Technique," *IEEE Proceedings of the 7th International Power Electronics and Motion Control Conference*, Harbin, China, Jun. 2-5, 2012, pp. 81-87.

Sun et al., "Extended Kalman Filter Based Grid Synchronization in the Presence of Voltage Unbalanced for Smart Grid," *Proceedings of the IEEE PES Innovative Smart Grid Techniques*, Anaheim, California, USA, Jan. 17-19, 2011, 4 pages.

Teodorescu et al., *Grid Converters for Photovoltaic and Wind Power Systems*, John Wiley and Sons, Ltd., 2011, pp. 1-398 (213 pages).

Huan et al., "A Novel Shunt Active Power Filter Based on Voltage Detection for Harmonic Voltage Mitigation," IEEE, 2007, pp. 1616-1620.

* cited by examiner

METHOD AND DEVICE FOR DETECTING AN ELECTRICAL VOLTAGE IN A SUPPLY NETWORK

BACKGROUND

Technical Field

The following invention relates to a method for recording the magnitude and phase of an electrical voltage in an electrical three-phase supply network for a fundamental and at least one harmonic. The present invention also relates to a method for compensating for harmonics in an electrical supply network, in particular on the basis of recording according to the invention. The present invention also relates both to an apparatus for recording the electrical voltage and to an apparatus for compensating for harmonics. The present invention also relates to a wind power installation in which such a method or a plurality of such methods is/are implemented or in which such an apparatus or a plurality of such apparatuses is/are installed.

Description of the Related Art

In order to feed electrical power into an electrical supply network which usually has a three-phase construction, it is necessary to record the magnitude and phase of the voltage, which also implies the recording or the knowledge of the frequency. The requirements for recording such voltages are becoming increasingly higher, which also affects, in particular, the speed for recording changes. A method for quickly and precisely recording the magnitude and phase of the voltage is described, for example, in the U.S. Pat. No. 8,981,755.

In addition, particularly with wind power installations which operate with a full converter concept, that is to say completely feed electrical power from the wind power installation into the network via an inverter, it is possible to specifically adapt the quality of the electrical power fed in to asymmetries in the network.

One example of feeding in an asymmetrical three-phase current is described in the US Patent Application Publication No. 2013/0141951. The method of symmetrical components is used there. In this case, current components of the positive-sequence system and current components of the negative-sequence system are produced independently of one another and are then superimposed to form the desired unbalanced current and are fed in.

The quality of such a feed ultimately also depends on the quality with which asymmetries are recorded. In this case, it should be borne in mind that the concept previously functioned in supply networks in such a manner that large power plants with dominant synchronous generators coupled directly to the network determined the quality and, in particular, the symmetry of the voltage fundamentally by the dominance of the current from the synchronous generator. Although there have already been initial considerations of specifically compensating for asymmetries for a relatively long time, as can be gathered from the U.S. Pat. No. 6,924,627 for example, the principle described above has nevertheless been maintained, not least also because the described synchronous generators of the large power plants can achieve such compensation only passively through their design but not through active control.

In addition, in modern power systems, production units and consumers are increasingly being connected to the transmission or distribution network via frequency converters or rectifiers. The switching components of these power electronic systems result in contamination of the ideally sinusoidal 50 Hz or 60 Hz AC voltage by harmonics in the frequency range of up to approximately 10 kHz. These harmonics load different equipment in the power systems and are therefore attenuated by means of active or passive filters in the event of excessive occurrence.

In some power systems, wind power installations already provide a significant part of the power produced. They are often and sometimes predominantly connected to the network by means of frequency converters and therefore, in the worst-case scenario, likewise contribute to harmonics in the network.

In the priority application for the present application, the German Patent and Trade Mark Office searched the following prior art: DE 100 32 447 A1, US 2012/0150468 A1, US 2014/0307488 A1, EP 2 223 405 B1, Azam Bagheri et al. "Detection of Grid Voltage Fundamental and Harmonic Components Using Kalman Filter and Generalized Averaging Method", Ming Sun et al. "Extended Kalman Filter Based Grid Synchronization in the Presence of Voltage Unbalance for Smart Grid" and Robert R. Bitmead et al. "A Kalman Filtering Approach to Short-Time Fourier Analysis".

BRIEF SUMMARY

Provided herein is a solution which provides possible ways of improving the network, including compensating for harmonics in the network.

A method is provided. According to the method, the magnitude and phase of the electrical voltage in the electrical three-phase supply network are recorded for a fundamental and at least one harmonic. In this case, an electrical supply network can also be understood as meaning an electrical distribution network, for example. It is fundamentally an electrical network to which many electricity producers and electricity consumers are connected.

An electrical three-phase voltage of the supply network is first of all measured.

The measured electrical three-phase voltage is then transformed into polar coordinates, thus resulting in a rotating voltage phasor for the fundamental. This phasor is referred to as the measured reference phasor and is accordingly also subsequently used. The transformation can be carried out, for example, in the manner in which it is also carried out in the U.S. Pat. No. 8,981,755.

In addition, values of at least one voltage phasor for the fundamental and of at least one voltage phasor of a harmonic to be recorded are respectively observed with the aid of a state observer. This denotes a state observer in the control-oriented sense. The observed values are now tracked on the basis of the measured reference phasor.

In other words, an observer model is taken as a basis, which observer model takes at least one fundamental and at least one harmonic as a basis for representing the network voltage and respectively uses at least one voltage phasor. The measured system is represented using a voltage phasor for the fundamental, the magnitude and phase of this voltage phasor also being able to change as a result of continuous measurement and transformation.

The comparison for the tracking of the observer is carried out, in particular, by comparing this measured value in polar coordinates, that is to say the values of this one rotating voltage phasor from the measurement, with the sum of all voltage phasors taken as a basis by the observer.

The state observer preferably operates on the basis of a recorded network frequency, the recorded network frequency being input to the state observer as an input variable. It is therefore proposed that the state observer does not observe the network frequency as a state to be observed and possibly tracked, but rather assumes that the recorded value for the frequency which has been input to it is given and takes it as a basis. This makes it possible to improve the stability or, in other words, stabilize the observation because this frequency, which affects every rotating observed voltage phasor or is a characteristic variable of such a voltage phasor, is a fixed variable. During observation, the observer can concentrate on the magnitude and phase, and interaction between the frequency, on the one hand, and the magnitude and phase, on the other hand, which is possibly interfering or even jeopardizes stability, is thereby excluded.

One embodiment proposes that the state observer observes the values of the voltage phasors with the aid of an up-to-date observer matrix and the up-to-date observer matrix is selected from a plurality of pre-calculated observer matrices on the basis of the recorded network frequency. Such an observer matrix is a known component in an observer structure and fundamentally has the task of tracking the observed states on the basis of comparison measured values. The reference phasor is used here as comparison measured values. In order to take into account varying frequencies in the observation here, the calculation of frequency-dependent observer matrices may be very complicated. Under certain circumstances, the complexity may exceed the available computing capacity of a microcontroller in a predefined time step, with the result that a calculation is not possible with the required clock rate. This complexity can be reduced by using previously calculated observer matrices which are then selected on the basis of the frequency, that is to say on the basis of a respective currently recorded frequency, in particular. Occasionally, this actually makes such consideration of the frequency variation possible. In the case of frequencies for which there is no predetermined observer matrix, which is also a matter of the frequency recording accuracy, this matrix can be determined by interpolating between two observer matrices.

A Kalman filter is preferably used as the state observer. In this respect, it is also possible to refer to filtering during the present observation of the states or the state observer can be referred to as a filter. As a result of the use of a Kalman filter, the observation or the filtering is particularly well suited to taking into account, namely filtering out, interference, in particular measurement noise.

One embodiment proposes that a DC component is recorded and that a positive-sequence system and a negative-sequence system are respectively recorded by the state observer for the fundamental and for each harmonic to be recorded of the electrical voltage to be recorded. As a result, the state observer can also take into account and record an asymmetry of the three-phase voltage. Even if there is no significant asymmetry, which need not be known before the measurement, such recording of a negative-sequence system can also be carried out. If appropriate, the component of the negative-sequence system will be accordingly small. During this recording of the positive-sequence system and the negative-sequence system, a consideration in the sense of the method of symmetrical components is therefore taken as a basis.

A voltage phasor is preferably taken as a basis for the DC component and two voltage phasors are respectively taken as a basis for the fundamental and for each harmonic to be recorded and their values are observed, with the result that a voltage phasor for a positive-sequence system and a voltage phasor for a negative-sequence system are namely respectively assumed. For the DC component as well, it may be useful to assume two values, namely the real part and the imaginary part, of the voltage phasor because a phasor can also be calculated here at least according to a formula when using the method of symmetrical components. A very large number of harmonics are preferably recorded, for example 25 harmonics, that is to say recording up to the 25th harmonic. In this case, if the first harmonic is the fundamental, the result is 51 phasors and therefore 102 values.

According to one embodiment, the method for recording the electrical voltage is characterized in that the electrical three-phase voltage of the supply network is measured at a transformer connected to the electrical supply network. It is possible to easily and reliably measure at such a transformer, in particular at such a transformer which is used to feed electrical current into the electrical supply network.

The measurement at such a transformer is particularly advantageous when electrical current is fed in via this transformer and the feed takes into account the measurement or recording of the electrical voltage of the electrical supply network. Distortions can be avoided here, in particular if an at least partially compensating current is fed in via this transformer on the basis of the observed harmonics.

The measurement preferably takes place on that side of the transformer which electrically faces a wind power installation which feeds the electrical supply network via this transformer. This wind power installation can in particular then take into consideration these recorded voltage values, in particular observed harmonics, and correspondingly adapt the feed of the electrical current. In particular, it can shape the electrical current to be fed in such that it is possible to compensate for or at least reduce observed harmonics of the network voltage.

The measured voltage is preferably transformed into polar coordinates with the aid of the Clarke transformation assuming that the voltage is free of the zero-sequence system. This also corresponds to the transformation described in the above-mentioned document (U.S. Pat. No. 8,981,755). It is assumed in this case that there is no zero-sequence system, which is also a frequent assumption when using the theory of symmetrical components. However, the assumption of freedom from the zero-sequence system does not necessarily concomitantly include the assumption of the freedom from DC components. Rather, there may be different DC components for each phase in the three-phase power supply system, with the result that they are also found in the positive-sequence and negative-sequence system components again after the transformation.

A method for feeding in electrical current is provided. According to this, electrical current is fed into an electrical three-phase supply network and this method comprises the steps of:

recording the electrical voltage in the supply network by means of a method according to at least one of the preceding embodiments, at least one harmonic being recorded, and producing an electrical current for feeding into the electrical supply network, the electrical current comprising a compensation current component in order to reduce the at least one recorded harmonic.

The method therefore initially also presupposes an electrical three-phase supply network which also takes as a basis the method explained above for recording electrical voltage in such an electrical three-phase supply network. An electrical distribution network may therefore also be concomitantly included here, to name just one example.

The electrical voltage is therefore also recorded by means of a method described above. This accordingly also comprises recording, namely observing, values of at least one harmonic of the voltage. A value, namely according to the amplitude and phase, is therefore available for such a harmonic and can now be used to at least reduce, ideally completely compensate for, such a recorded harmonic. The electrical current to be fed in comprises, for this purpose, a compensation current component which therefore accordingly comprises at least one harmonic. In particular, the current therefore comprises a basic component or fundamental in order to namely feed corresponding power into the electrical supply network. A compensation current component is now superimposed on this fundamental, that is to say also on such an idealized profile, that is to say is added in the electrical sense. This compensation current component is intended to reduce the recorded harmonics or at least some of the latter.

One embodiment proposes that the compensation current component has at least one current harmonic and a current harmonic is respectively determined by an amplitude and a phase and on the basis of the observed harmonics of the recorded voltage. The observation of the harmonics of the voltage therefore provides information, specifically a clearly defined description of this harmonic or these harmonics of the voltage. The compensation current component then preferably has a similar structure. The compensation current component therefore has a corresponding current harmonic to a recorded voltage harmonic, for example. The amplitude of the current harmonic can be in a predetermined ratio or at least relationship with respect to the harmonic of the voltage. A phase is also accordingly set such that the compensation or at least reduction can be carried out.

A positive-sequence system and a negative-sequence system are preferably recorded for each harmonic when recording the voltage. The corresponding current harmonic preferably also accordingly has a positive-sequence system and a negative-sequence system or a positive-sequence system component and a negative-sequence system component. In this case too, an amplitude and a phase can then be respectively determined for the current harmonic. However, it also comes into consideration that only the positive-sequence system component is considered and it also comes into consideration, in particular, that the compensation current component fundamentally determines only one component in each case for each current harmonic and, in this respect, does not consider the asymmetry on which the consideration of symmetrical components is based. The background here is that the consideration of the positive-sequence system and the negative-sequence system may be useful for the observer in order to ensure its overall functionality and overall quality and accuracy. However, it may often then be sufficient to consider only the positive-sequence system component and to generate it during feeding.

It is pointed out here again that the harmonic and the current harmonic each mean a harmonic of one order and a plurality of harmonics respectively denote a harmonic, but with different frequencies.

Another embodiment proposes that an amplitude of a current harmonic in the compensation current component is respectively adjusted using a controller. The controller receives here, as an input signal, a control difference between the desired voltage value and the observed actual voltage value of the relevant harmonic of the recorded voltage. In the simplest case, this means that the desired voltage value has the value 0 and the harmonic is finally intended to be reduced to 0. In certain cases, it may naturally also be useful not to set the value 0 here. This difference value, which is referred to as a control difference here, is then passed to the controller between the desired voltage value and the actual voltage value of the relevant harmonic. This controller may be a PID controller, a PI controller or a PD controller, for example. In the simplest case, a P controller is used and the recorded voltage difference then results in an amplitude of the current harmonic corresponding to this factor which naturally also takes into account the different units between the voltage and the current. As a result, that is to say in the case of a pure P controller, the relevant harmonic of the voltage will then probably not be able to be completely compensated for.

In order to completely compensate for this harmonic of the voltage, a PID controller is proposed, for example. However, it should be borne in mind in this case that it should be previously ensured that there is also sufficient actuating power. It is then possible to completely or virtually completely compensate for the relevant harmonic of the voltage using such a PID controller. If sufficient actuating power is not available, the controller could then reach a limit.

If appropriate, a PD controller can provide a dynamic response without having the requirement for complete compensation.

An inverter which produces an electrical current to be fed into the three-phase electrical power supply system is provided. This inverter is prepared to operate with a method explained above according to at least one of the embodiments relating to the method for feeding in electrical current. In this respect, this also relates substantially to a control device on which this method for feeding in the current, that is to say the method for producing the current to be fed in, is implemented.

A wind power installation comprising such an inverter is also proposed. With the wind power installation, such a current can then therefore be fed in and not only can power therefore be fed into the electrical supply network but also harmonics of the voltages can be compensated for or reduced. Accordingly or alternatively, it is proposed that the wind power installation implements at least one method described above, namely both a method for recording the voltage and a method for producing the current to be fed in.

In addition, the above-described method for determining harmonics of the network voltage can analogously also be used to determine harmonics in the electrical current.

BRIEF DESCRIPTION OF THE SEVERAL VIEWS OF THE DRAWINGS

The invention is now explained in more detail below by way of example using exemplary embodiments and with reference to the accompanying figures.

DETAILED DESCRIPTION

Figure 1:
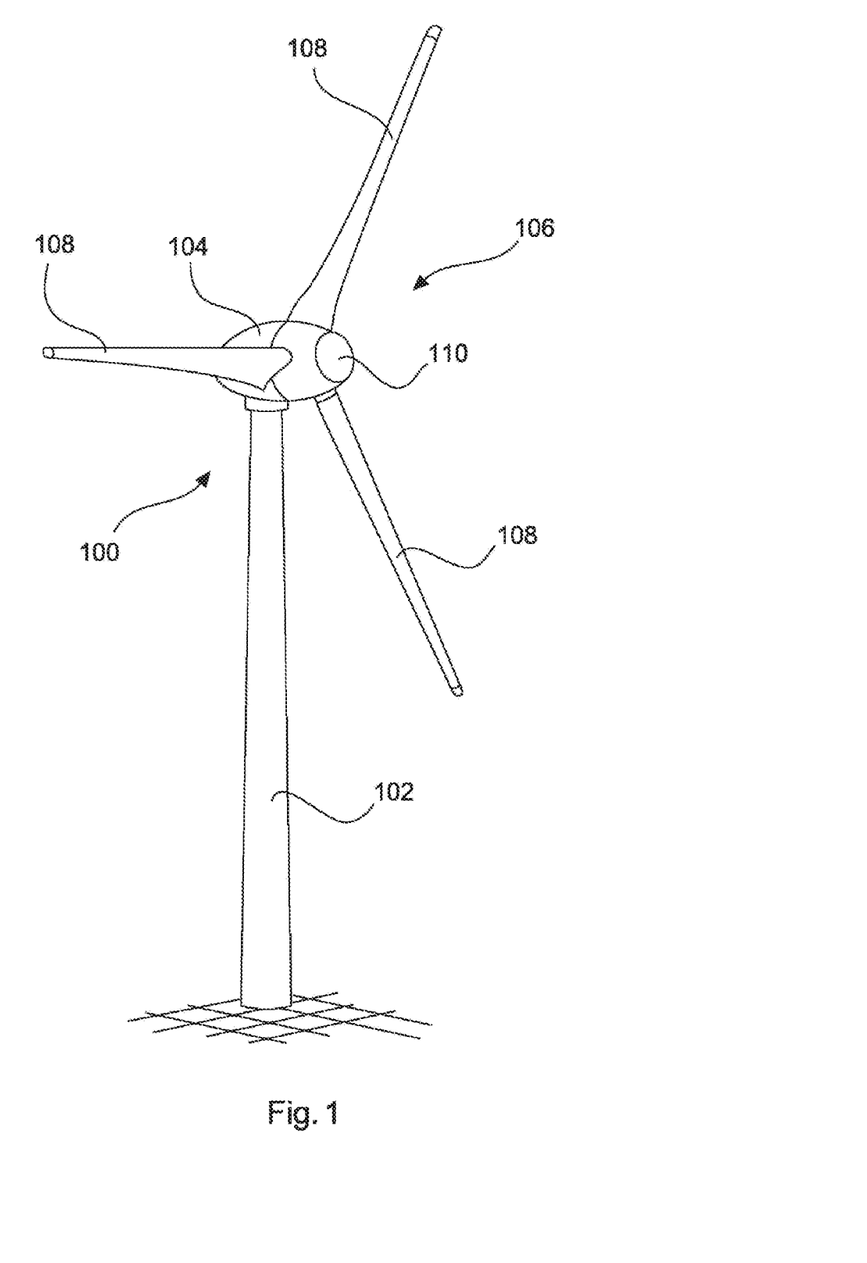
FIG. 1 schematically shows a perspective illustration of a wind power installation.

FIG. 1 shows a wind power installation 100 having a tower 102 and a nacelle 104. A rotor 106 having three rotor blades 108 and a spinner 110 is arranged on the nacelle 104.

During operation, the rotor 106 is caused to rotate by the wind and thereby drives a generator in the nacelle 104.

Figure 2:
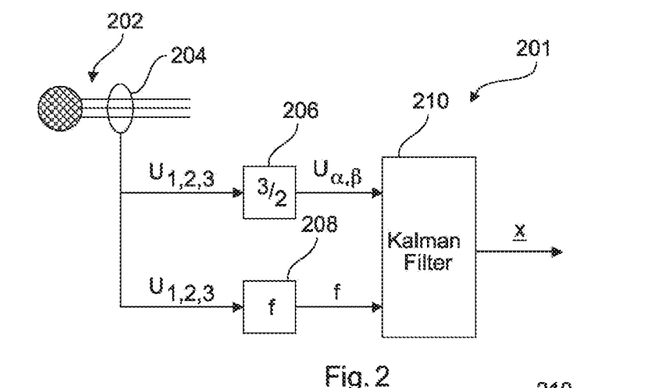
FIG. 2 shows a simplified structure for explaining a method for recording the electrical voltage according to one embodiment.

FIG. 2 shows a measuring arrangement 201 for recording an electrical voltage in an electrical three-phase, schematically illustrated supply network 202. According to this, a measuring sensor 204 is used to measure the electrical voltage $U_{1,2,3}$ in three phases. The measurement is carried out, in particular, for each sampling step of the subsequent evaluation. The measured voltage is supplied to a transformation block 206 which transforms these three respectively measured voltage values into polar coordinates which are referred to as $U_{\alpha,\beta}$ here.

The measured voltage is also input to a frequency determination block 208 which determines the frequency f, namely the network frequency of the supply network 202, from the measured voltage values. The frequency is therefore determined by this frequency determination block 208 by means of an algorithm which is independent of the Kalman filter. A filter for determining the network frequency from a space vector voltage angle can be used here, for example. Alternatively, a discrete Fourier transform (DFT) of the three voltage values is preferably used to determine a filtered angle of the network voltage. A frequency signal can in turn be extracted from said filtered angle by means of suitable filtering. The advantage of using the angle obtained from the DFT over using the space vector angle is the filter effect in the case of integer harmonics of the fundamental.

Figure 3:
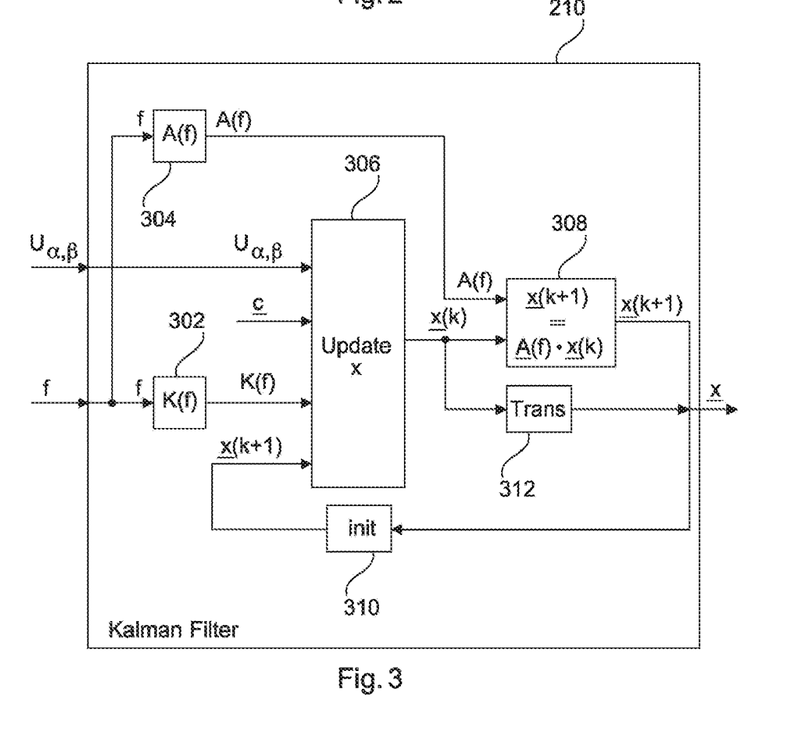
FIG. 3 shows a more detailed structure of a function block from FIG. 2.
Figure 4:
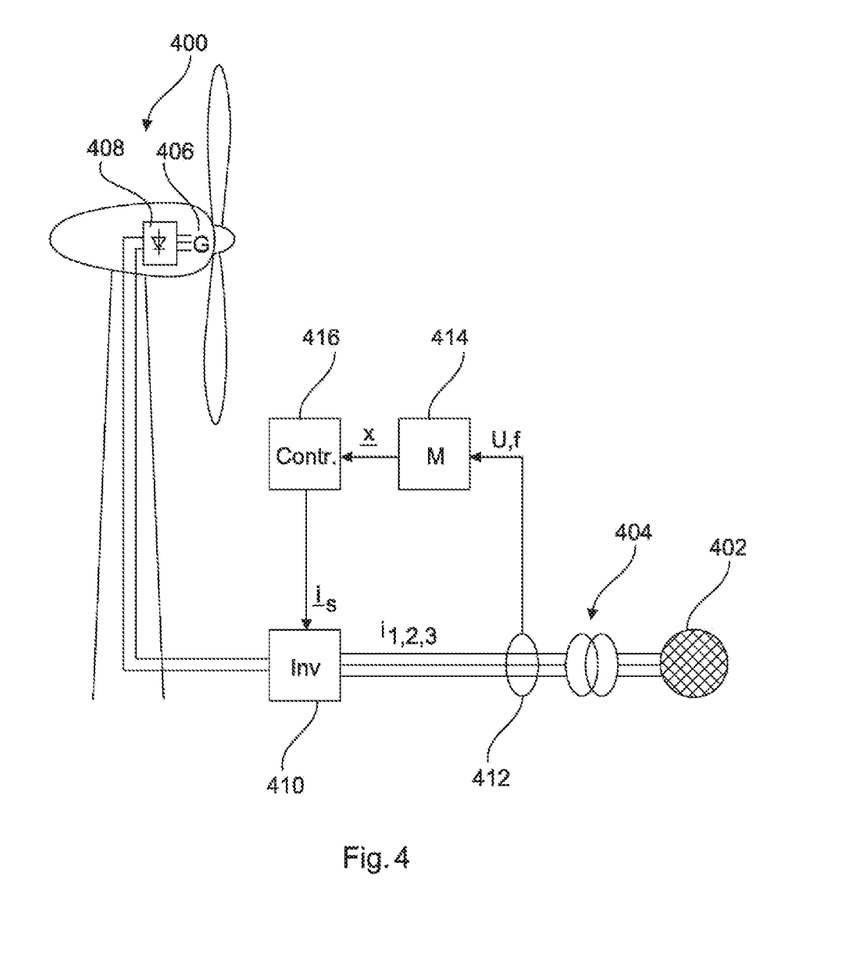
FIG. 4 schematically shows an arrangement for feeding electrical current into an electrical supply network using a wind power installation according to one embodiment of the invention.

It is pointed out that the block diagram in FIG. 2 and also in FIG. 3 and partially in FIG. 4 is used to illustrate the method used.

The individual functions of the illustrated blocks need not necessarily be carried out in such a separate block but can also be implemented together in a microprocessor or another computing unit.

In any case, the transformed polar coordinates $U_{\alpha,\beta}$ and the recorded network frequency f are input to the Kalman filter block 210. The Kalman filter block 210 is therefore a filter which determines the recorded states x as the output variable and outputs them. These recorded states which are represented here by this state vector x may comprise, in particular, values of voltage phasors for a DC component, a positive-sequence system and a negative-sequence system of the fundamental, respectively, and a positive-sequence system and a negative-sequence system of each recorded harmonic, respectively. If the voltage up to the harmonic of the 25th order is considered, for example, in which case the first order would be the fundamental, this state vector x may comprise 102 values. This number results from two values for the DC component, namely the real part and the imaginary part which are referred to as $u_{\alpha DC}$ and $u_{\beta DC}$. Two values for the positive-sequence system and two values for the negative-sequence system, namely the real part and the imaginary part of the phasor in each case, result for the fundamental and each harmonic. For the fundamental, as the first order, these values are then the values $u_{\alpha(1+)}$ and $u_{\beta(1+)}$ for the positive-sequence system and accordingly the values $u_{\alpha(1-)}$ and $u_{\beta(1-)}$ for the negative-sequence system. Four values may also be analogously provided for each further order.

These values, that is to say this state vector recorded in this manner, can then be used to produce current for feeding electrical current into the supply network 202.

Details of the Kalman filter block 210 are schematically explained in FIG. 3. FIG. 3 therefore shows this Kalman filter block 210 which receives, as can already be gathered from FIG. 2, the measured voltage $U_{\alpha,\beta}$ which has been transformed into polar coordinates and the network frequency f determined by the frequency determination block 208 as input variables. The observer matrix K is determined in the observer matrix block 302 on the basis of this determined network frequency f and is accordingly output as the observer matrix K(f). The observer matrix block 302 determines this observer matrix K by taking the corresponding observer matrix K from a table on the basis of the frequency f. If no observer matrix K is stored for the exact frequency, it can possibly be determined from observer matrices of adjacent frequencies by means of interpolation.

The system matrix A(f) is likewise determined in the system matrix block 304 on the basis of the frequency. In this case, the system matrix is calculated in a known manner in the system matrix block 304.

The system states $\underline{x}$ to be recorded are fundamentally continuously recalculated in the update block 306. In this case, this update block 306 behaves approximately like a system-describing model, in which case the respectively currently measured voltage $U_{\alpha,\beta}$ transformed into polar coordinates is also taken into account for the purpose of tracking or adjustment, to express it clearly.

In addition, the observer matrix K(f) is also required for this purpose and is always received by the update block 306 for this purpose from the observer matrix block 302 in an up-to-date form. A matrix $\underline{C}$ describing the system is likewise needed and is therefore illustrated as an input to the update block 306.

The updated state vector $\underline{x}(k+1)$ is also used. This updated state vector $\underline{x}(k+1)$ is calculated from the last state vector $\underline{x}(k)$ and the system matrix A(f) in the state block 308. The state block 308 uses the system matrix A(f) for this purpose, the state block receiving said system matrix from the system matrix block 304 in an up-to-date form in each case. The state block 308 receives the old state vector $\underline{x}(k)$ from the update block 306 in an up-to-date form.

As already described above, the updated state vector $\underline{x}(k+1)$ is therefore likewise considered to be an input variable for the update block 306. An initialization process can be carried out in the initialization block 310 for this updated state vector $\underline{x}(k+1)$, in particular for the purpose of starting the process.

The Kalman filter 210 can therefore now output the respectively recorded state vector $\underline{x}(k)$ as the state vector $\underline{x}$. This state vector can possibly also be subjected to a transformation, possibly also only in the sense of multiplication by a constant factor in the transformation block 312. In that case, the state vector $\underline{x}$ illustrated in FIG. 3 would naturally accordingly differ from the internal state vector $\underline{x}(k)$.

This state vector $\underline{x}$ can now contain values for the DC component, phasor of the fundamental and phasor of harmonics, which can be used to determine currents to be fed in. This is illustrated in FIG. 4. FIG. 4 illustrates this for a wind power installation 400, but other feeding-in apparatuses can also record such measured values and can use them to control current, namely current to be fed in.

The structure in FIG. 4 illustrates a supply network 402 which is fed via a transformer 404. For this purpose, the wind power installation 400 uses a generator 406 to produce electrical current which can be rectified in a rectifier 408 and can be supplied to an inverter 410.

This inverter 410 produces a three-phase current $i_{1,2,3}$ which can be fed into the supply network 402 via this transformer 404.

It is now proposed to record voltage and frequency using a symbolically illustrated measuring sensor 412 and to supply them to a measuring block 414. The measuring block 414, together with the measuring sensor 412, can correspond to the measuring arrangement 201 in FIG. 2. The frequency f would then only be determined in the measuring block 414 from the recorded voltage, but the frequency f is also depicted as an input variable for the measuring block 414 for the purpose of illustration in FIG. 4.

The measuring block 414 can then output, as an output variable, the state vector $\underline{x}$ which can contain values for the DC component, the fundamental and the harmonic, in particular also for a positive-sequence system and a negative-sequence system in each case, as explained above with respect to FIG. 2.

These values, that is to say the state vector $\underline{x}$, can then be input to the control block 416 which can contain a controller, for example. Deviations can also be calculated for each harmonic in this control block 416 on the basis of the recorded voltage values, which are therefore contained in the state vector $\underline{x}$, and can be used to determine the corresponding current values. In particular, a compensation current component is determined from the deviations or in another manner from the recorded harmonics of the voltage in each case, that is to say for each harmonic. This one compensation current component or this plurality of compensation current components is/are then superimposed on the current value for the fundamental, which is namely intended to be used to feed in electrical power, possibly also electrical reactive power.

The control block 416 then finally determines desired current values $\underline{i}_s$ which are input as such to the inverter 410. These desired current values take into account the current to be fed in together with superimposition, that is to say the fundamental and harmonic(s). The inverter 410 can then produce the corresponding current values on the basis of these desired current values $\underline{i}_s$. Alternatively, a provision may be made for the fundamental of the current to be fed in and the at least one harmonic to be superimposed to be produced separately and to then be superimposed, that is to say added. For this purpose, it is proposed to provide a plurality of inverters, at least one of which produces the fundamental or part of the latter and at least one other of which produces the at least one harmonic or part of the latter.

In modern power systems, production units and consumers are being increasingly connected to the transmission or distribution network via frequency converters or rectifiers. The switching components of these power electronic systems result in contamination of the ideally sinusoidal 50 Hz or 60 Hz AC voltage by harmonics in the frequency range of up to approximately 10 kHz. These harmonics load different equipment in the power systems and are therefore attenuated by means of active or passive filters in the event of excessive occurrence.

In some power systems, wind power installations already provide a significant part of the power produced. They are predominantly connected to the network by means of frequency converters and therefore, in the worst-case scenario, likewise contribute to harmonics in the network.

Described herein is a method for detecting and compensating for harmonics in the network voltage of a power system using a wind power installation connected to this system via a full converter. The wind power installation is therefore enabled to feed in a current in order to reduce voltage harmonics or negative-sequence system voltages. These can be caused by other production units or consumers, for example.

For this purpose, the following method is proposed, in particular:

1. Measuring the terminal voltages at the installation transformer on the wind power installation side.

2. Converting the three terminal voltages into a rotating voltage phasor using the Clarke transformation assuming that the voltages are free of the zero-sequence system, the voltage phasor being given by magnitude and phase.

3. Using a filter to observe the DC component and the positive-sequence system and negative-sequence system voltages of multiples of the network frequency from the first order, that is to say the fundamental, to a defined highest possible harmonic order. In this case, a further input to the filter is a network frequency determined in another manner. The filter may be in the form of a state observer, in particular a Kalman filter.

4. Calculating a desired compensation current in harmonic orders selected for compensation via a control or regulating rule. The adjustment is preferentially made via a proportional factor $k_i$, which, for the ith order of the voltage, defines a compensation current of $k_i$ A to be applied for each V of voltage harmonic amplitude. A further preferred calculation of the compensation current is the calculation by applying a PID controller to the difference between a desired voltage, for example 0 V, and the actual voltage of the corresponding component. With a sufficient ability of the converter to set the current, it is therefore ideally possible to completely compensate for harmonic or negative-sequence system voltages.

5. Setting the compensation current in addition to the desired active and reactive current in the fundamental via a current control method. A hysteresis current controller, also referred to as a tolerance band controller, is preferably used since very fast reaction times and a high degree of robustness with respect to variable network parameters can be achieved here.

Particular attention must be paid to the suitable filtering of the voltage phasors in order to quickly and precisely determine correct voltage amplitudes in the different frequency ranges, namely DC voltages, the fundamental and harmonics.

Existing methods for determining harmonic components in the voltage are often based on recursively formulated discrete Fourier transforms of the measurement variables. They are distinguished by a high degree of numerical robustness. However, the filter quality is ensured only when the sampling frequency is an integer multiple of the fundamental frequency of the measurement signal and of the spacing between two frequency components to be identified. Since the network frequency in a power system is generally subject to slight fluctuations and, in addition, the ability to use a method in systems having a different rated frequency (for example 50 and 60 Hz) is an advantage, a high filter quality for different network frequencies and a constant sampling rate is of great importance for the widest possible use.

Different solutions to this problem are known, but all have sometimes considerable disadvantages. One possibility is to change the sampling rate of the algorithm on the basis of the network frequency, as can be gathered from reference [1]. However, such a change in the sampling rate is often not desired since other algorithms are also executed on the computing unit, for which a fixed sampling rate is important, as is the case in a time-discrete controller, for example. Another possibility is to design a phase or frequency locked loop, as can be gathered from reference [2]. However, either a lack of filter effect in the case of abnormal network states can be observed in these algorithms, particularly in connection with a phase locked loop, or considerable stability problems can be observed, in particular in the case of low sampling rates in the digital implementation, in particular in connection with a frequency locked loop.

A third solution category is constituted by Kalman filters which are designed on the basis of state space models of the dynamic response of the network voltages. In this case, it is possible to distinguish between filters for a constant network frequency, as can be gathered from reference [3], in which a linear dynamic response results, and filters for a variable network frequency, as can be gathered from reference [4], which are based on non-linear differential equations. The latter filters recursively calculate the observer matrix which is optimum under the given noise parameters by using a state space description based on the up-to-date state variables in the synthesis equations in each time step. With corresponding parameterization, excellent filter properties result in this case even with a varying network frequency and under abnormal network conditions, for example asymmetrical voltages or voltages heavily loaded with harmonics, since all of these effects can be taken into account in the state space description of the system.

One disadvantage of the method of the extended Kalman filter for observing state variables of a non-linear system is, however, the recursive calculation of the observer matrix. For this purpose, it is necessary to multiply the matrices of the state space descriptions by one another and by vectors of the measurement and state variables several times in each computing step. In the case of a large filter dimension for taking into account numerous harmonic orders, this has a negative effect on the required computing times. With a restricted computing capacity, execution within the cycle time limited by the sampling rate is no longer possible under certain circumstances.

In contrast, assuming that the network frequency is constant, there is the possibility of pre-calculating the observer matrix for the Kalman filter by solving an algebraic Riccati equation owing to the time-invariant and linear system equations in this case, which can be gathered from reference [3]. According to at least one embodiment, the pre-calculation of the observer matrix is proposed here for different network frequencies.

According to reference [3], the following frequency-dependent differential equation system is used as the basis for deriving the observer implementation:

$$x(k+1) = A(f)x(k)$$

$$y(k) = Cx(k)$$

$$A(f) = \begin{bmatrix} A_1(f) & & 0 & 0 & 0 & 0 & 0 & 0 & 0 & 0 & 0 & 0 \\ & & 0 & 0 & 0 & 0 & 0 & 0 & 0 & 0 & 0 & 0 \\ & & 0 & 0 & 0 & 0 & 0 & 0 & 0 & 0 & 0 & 0 \\ & & 0 & 0 & 0 & 0 & 0 & 0 & 0 & 0 & 0 & 0 \\ 0 & 0 & 0 & 0 & & & \cdots & 0 & 0 & 0 & 0 & 0 \\ 0 & 0 & 0 & 0 & & & & 0 & 0 & 0 & 0 & 0 \\ 0 & 0 & 0 & 0 & A_2(f) & & & 0 & 0 & 0 & 0 & 0 \\ 0 & 0 & 0 & 0 & & & & 0 & 0 & 0 & 0 & 0 \\ & \vdots & & & & \ddots & & & \vdots & & \\ 0 & 0 & 0 & 0 & 0 & 0 & 0 & 0 & & & 0 & 0 \\ 0 & 0 & 0 & 0 & 0 & 0 & 0 & 0 & & & 0 & 0 \\ 0 & 0 & 0 & 0 & 0 & 0 & 0 & 0 & A_N(f) & & 0 & 0 \\ 0 & 0 & 0 & 0 & 0 & 0 & 0 & 0 & & & 0 & 0 \\ 0 & 0 & 0 & 0 & 0 & 0 & 0 & 0 & 0 & 0 & 1 & 0 \\ 0 & 0 & 0 & 0 & 0 & 0 & 0 & 0 & \cdots & 0 & 0 & 0 & 0 & 1 \end{bmatrix}$$

$$A_i(f) = \begin{bmatrix} \cos(2\pi T_s i f) & -\sin(2\pi T_s i f) & & & \\ & & & & 0 \\ \sin(2\pi T_s i f) & \cos(2\pi T_s i f) & & & \\ & & \cos(2\pi T_s i f) & \sin(2\pi T_s i f) \\ & 0 & & \\ & & -\sin(2\pi T_s i f) & \cos(2\pi T_s i f) \end{bmatrix}$$

$$C = \left[ \begin{pmatrix} 1 & 0 \\ 0 & 1 \end{pmatrix}_1 \cdots \begin{pmatrix} 1 & 0 \\ 0 & 1 \end{pmatrix}_{N+1} \right]$$

$$x(k) = [\, x_1(k) \quad x_2(k) \quad \ldots \quad x_N(k) \quad u_{DC\alpha}(k) \quad u_{DC\beta}(k) \,]^T$$

$$x_i(k) = [\, u_{i(1)\alpha}(k) \quad u_{i(1)\beta}(k) \quad u_{i(2)\alpha}(k) \quad u_{i(2)\beta}(k) \,]$$

$$y(k) = [\, u_\alpha(k) \quad u_\beta(k) \,]^T$$

In these equations, k denotes the instantaneous execution step, $T_S$ denotes the sampling time of the discrete implementation of the algorithm, f denotes the network frequency, i denotes an index which assumes values of 1 to the number of the highest harmonic order N calculated in the observer, $u_{DC\alpha}(k)/u_{DC\beta}(k)$ denote the alpha and beta DC voltage components, $u_{i(1)\alpha}(k)/u_{i(1)\beta}(k)$ denote the alpha and beta positive-sequence system voltage components of the ith order (that is to say for i=1 fundamental, for i>1 harmonic components) and $u_{i(2)\alpha}(k)/u_{i(2)\beta}(k)$ denote the alpha and beta negative-sequence system voltage components of the ith order.

On the basis of these equations, an observer matrix K can be calculated for each network frequency f and can then be used in a standard observer implementation for observing the states. The equation for calculating the Kalman observer matrix using the state and measurement signal noise covariance matrices Q and R is known, for example from reference [6].

Using the matrix K, the state estimation is updated in each time step according to the known equation $$x(k|k)=x(k|k-1)+K^*(y(k)-C^*x(k|k-1))$$

In this case, x(k|k) denotes the state estimation from the instantaneous time step and x(k|k−1) denotes the state estimation for the instantaneous time step from the last time step.

According to at least one embodiment, in the method used here, the observer matrix is precalculated for a given state space description and a defined measurement and state noise level for different network frequencies comprising the entire desired operating range. At the execution time, the frequency is determined by means of an algorithm which is independent of the Kalman filter. Such an algorithm can be implemented by means of a frequency determination block, such as a frequency determination block illustrated in the figures. In this case, a suitable filter, for example, can be used to determine the network frequency from a space vector voltage angle. This frequency signal is used to select an observer matrix matching this frequency. In this case, it is possible to carry out interpolation in order to increase the resolution between different stored observer matrices at different frequencies.

This method therefore makes it possible to precisely and quickly calculate numerous harmonics of the network voltage in the positive-sequence system and negative-sequence system with a computing complexity which is considerably reduced in comparison with the non-linear, extended Kalman filter. Unlike when using frequency locked loops, as is also described in reference [5] using a Kalman filter for example, the algorithm described here does not use a closed loop to determine the network frequency which, owing to its non-linear dynamic response which is difficult to analyze, is always a stability risk for the filter algorithm. Rather, the network frequency is determined separately and is used only to select the observer matrix.

Furthermore, the method described above can also be used to determine harmonics in the current.

The above-mentioned references are as follows:

[1] B. P. McGrath, D. G. Holmes, J. Galloway: Improved Power Converter Line Synchronisation using an Adaptive Discrete Fourier Transform (DFT). Proceedings of IEEE 33$^{rd}$ Annual Power Electronics Specialists Conference, 2002, Vol. 2, pp. 821-826.

[2] R. Teodorescu, M. Liserre, P. Rodriguez: Grid Converters for Photovoltaic and Wind Power Systems. John Wiley & Sons, Chichester, 2011.

[3] R. R. Bitmead, A. C. Tsoi, P. J. Parker: A Kalman Filtering Approach to Short-Time Fourier Analysis. IEEE Transactions on Acoustics, Speech and Signal Processing, Vol. ASSP-34(6), December 1986, pp. 1493-1501.

[4] B. La Scala, R. R. Bitmead: Design of an Extended Kalman Filter Frequency tracker. IEEE Transactions on Signal Processing, Vol. 44(3), March 1996, pp. 739-742.

[5] M. S. Reza, M. Ciobotaru, V. G. Agelidis: Instantaneous Power Quality Analysis Using Frequency Adaptive Kalman Filter Technique. Proceedings of 7th International Power Electronics and Motion Control Conference, Harbin, China, June 2012, pp. 81-87.

[6] T. Glad, L. Ljung: Control Theory. Taylor & Francis, London, 2000.

The invention claimed is:

1. A method for recording a magnitude and phase of electrical voltage in an electrical three-phase supply network for a fundamental and at least one harmonic, the method comprising:
   measuring an electrical three-phase voltage of the supply network,
   transforming measured voltage values into polar coordinates using a rotating voltage phasor for the fundamental as a measured reference phasor,
   respectively observing, at least in part by a state observer, values of at least one voltage phasor for the fundamental and of at least one voltage phasor for at least one harmonic to be recorded, wherein the state observer is a Kalman filter, and
   tracking the observed values based on the measured reference phasor.

2. The method according to claim 1, wherein the state observer operates based on a recorded network frequency and the recorded network frequency is input to the state observer as an input variable.

3. The method according to claim 2, comprising:
   selecting, based on the recorded network frequency, an up-to-date observer matrix from a plurality of precalculated observer matrices, and
   observing, by the state observer, the values of the voltage phasors using the up-to-date observer matrix.

4. The method according to claim 1, comprising:
   recording, by the state observer, a positive-sequence system and a negative-sequence system for the fundamental and for each harmonic to be recorded, respectively.

5. The method according to claim 1, comprising:
   observing a voltage phasor for a positive-sequence system and a voltage phasor for a negative-sequence system, and
   determining the fundamental and each harmonic to be recorded based on the voltage phasor for the positive-sequence system and the voltage phasor for the negative-sequence system, respectively.

6. The method according to claim 1, comprising:
   measuring the electrical three-phase voltage of the supply network at a transformer connected to the electrical supply network.

7. The method according to claim 1, comprising:
   transforming the measured voltage values into polar coordinates using a Clarke transformation that assumes that the measured voltages are free of a zero-sequence system.

8. The method according to claim 1, comprising:
   recording the at least one harmonic, and
   producing an electrical current for feeding into the electrical supply network, the electrical current comprising a compensation current component in order to reduce the at least one recorded harmonic.

9. The method according to claim 8, wherein the compensation current component has at least one current harmonic and a current harmonic of the at least one current harmonic is respectively determined by an amplitude and a phase and based on the observed harmonics of the recorded voltage.

10. The method according to claim 9, comprising:
adjusting, using a controller, an amplitude of the current harmonic of the compensation current component, and
receiving, by the controller, as an input signal representative of a difference between a desired voltage value and an observed actual voltage value of the harmonic of the recorded voltage.

11. The method according to claim 10, wherein the controller is selected from a list comprising:
a PID controller,
a PI controller,
a P controller, and
a PD controller.

12. The method according to claim 8, wherein the compensation current component is based on current harmonics as positive-sequence system and negative-sequence system components, respectively.

13. An inverter configured to:
produce an electrical current for feeding into an electrical supply network, the electrical current comprising a compensation current component for reducing at least one recorded harmonic, wherein an electrical three-phase voltage of the electrical supply network is measured and transformed into polar coordinates using a rotating voltage phasor for a fundamental as a measured reference phasor, and wherein a state observer respectively observes values of at least one voltage phasor for the fundamental and of at least one voltage phasor for at least one harmonic, and wherein the observed values are tracked based on the measured reference phasor, wherein the state observer is a Kalman filter.

14. A wind power installation having the inverter according to claim 13.

15. A wind power installation configured to operate according to the method of claim 1.

16. The method according to claim 4, comprising:
recording, by the state observer, a DC component.

17. The method according to claim 5, comprising:
determining a DC component based on a voltage phasor, and
recording the DC component.

18. The method according to claim 6, wherein the electrical three-phase voltage of the supply network is measured at a side of the transformer that electrically faces a wind power installation which feeds the electrical supply network via the transformer.

* * * * *